United States Patent
Ohba et al.

(10) Patent No.: US 8,492,740 B2
(45) Date of Patent: Jul. 23, 2013

(54) MEMORY ELEMENT AND MEMORY DEVICE

(75) Inventors: Kazuhiro Ohba, Miyagi (JP); Tetsuya Mizuguchi, Kanagawa (JP); Shuichiro Yasuda, Kanagawa (JP)

(73) Assignee: Sony Corporation, Tokyo (JP)

( * ) Notice: Subject to any disclaimer, the term of this patent is extended or adjusted under 35 U.S.C. 154(b) by 335 days.

(21) Appl. No.: 12/670,887

(22) PCT Filed: Jul. 31, 2008

(86) PCT No.: PCT/JP2008/063761
§ 371 (c)(1),
(2), (4) Date: Jan. 27, 2010

(87) PCT Pub. No.: WO2009/020041
PCT Pub. Date: Feb. 12, 2009

(65) Prior Publication Data
US 2010/0195371 A1    Aug. 5, 2010

(30) Foreign Application Priority Data
Aug. 6, 2007 (JP) ................ P2007-204031

(51) Int. Cl.
*H01L 29/02* (2006.01)
*H01L 47/00* (2006.01)
(52) U.S. Cl.
USPC ..... 257/2; 257/3; 257/4; 257/5; 257/E29.002; 257/E47.001
(58) Field of Classification Search
USPC ............ 257/2–5, E29.002, E47.001, E45.001
See application file for complete search history.

(56) References Cited

U.S. PATENT DOCUMENTS

| 6,635,914 B2* | 10/2003 | Kozicki et al. ................ 257/296 |
| 2006/0109708 A1 | 5/2006 | Pinnow et al. |
| 2006/0181920 A1 | 8/2006 | Ufert |
| 2007/0012959 A1* | 1/2007 | Hachino et al. ................ 257/260 |

FOREIGN PATENT DOCUMENTS

| DE | 102005003675 A1 | 11/2005 |
| JP | 2002-536840 | 10/2002 |
| JP | 2003-060083 | 2/2003 |
| JP | 2003-60083 | 2/2003 |

(Continued)

OTHER PUBLICATIONS

International Search Report (PCT/JP2008/063761) dated Nov. 4, 2008.
Supplementary European Search Report dated Jul. 29, 2011, for corresponding European Appln. No. 08791976.7.

(Continued)

*Primary Examiner* — Allison P Bernstein
(74) *Attorney, Agent, or Firm* — K&L Gates LLP

(57) ABSTRACT

The capability of retaining a resistance value of a stored state and an erased state is improved in a resistance variation-type memory device. A memory layer 5 including a high-resistance layer 2 and an ion source layer 3 is provided between a lower electrode 1 and an upper electrode 4. The ion source layer 3 contains Al (aluminum) as an additive element together with an ion conductive material such as S (sulfur), Se (selenium), and Te (tellurium) (chalcogenide element) and a metal element to be ionized such as Zr (zirconium). Since Al is included in the ion source layer 3, the high-resistance layer which includes Al (Al oxide) is formed on an anode in erasing operation. Thus, a retaining property in a high-resistance state improves, and at the same time, an operating speed is improved.

35 Claims, 14 Drawing Sheets

FOREIGN PATENT DOCUMENTS

| | | |
|---|---|---|
| JP | 2003-060090 | 2/2003 |
| JP | 2003-60090 | 2/2003 |
| JP | 2007-280591 | 10/2007 |
| WO | 03/020998 A2 | 3/2003 |
| WO | 2005/029585 | 3/2005 |
| WO | 2005-029585 | 3/2005 |
| WO | 2007-069725 | 6/2007 |
| WO | 2007/069728 | 6/2007 |

OTHER PUBLICATIONS

Japanese Patent Office, Notice of reasons for refusal, issued in connection with Japanese Patent Application No. 2007-204031, dated Jun. 5, 2012. (5 pages).

Nikeei Electronics, Jan. 20, 2003, p. 104.

* cited by examiner (WITHOUT HIGH-RESISTANCE LAYER)

(A)

(B)

MEMORY ELEMENT AND MEMORY DEVICE

CROSS REFERENCE TO RELATED APPLICATIONS

The present application is a national stage of International Application No. PCT/JP2008/063761 filed on Jul. 31, 2008 and claims priority to Japanese Patent Application No. 2007-204031 filed on Aug. 6, 2007, the disclosures of which are incorporated herein by reference.

BACKGROUND

The present invention relates to a memory element and a memory device capable of storing binary or more information by a change in an electrical characteristic of a memory layer including an ion source layer.

DRAM (Dynamic Random Access Memory), which is fast in operation and high in density, has been widely used as RAM (Random Access Memory: random access memory) in information devices such as a computer. However, since a manufacturing process of the DRAM is complex as compared with an ordinary logic circuitry LSI (Large Scale Integration) used in electronic devices or with a signal process, a production cost is high. Also, the DRAM is a volatile memory in which information is lost when power is turned off. Thus, it is necessary to frequently perform refresh operation, that is, to perform operation of reading out the written information (data), performing re-amplification, and performing rewrite again.

Accordingly, a flash memory, FeRAM (Ferroelectric Random Access Memory) (ferroelectric memory), MRAM (Magnetoresistive Random Access Memory) (magnetic memory element) and so forth for example have been proposed as a nonvolatile memory in which the information is not lost even when the power is turned off. In this memories, the information written therein can be retained continuously for a long period of time even when the power is not supplied.

However, each of the various nonvolatile memories mentioned above has both advantages and disadvantages. The flash memory is high in integration, but is disadvantageous in terms of operation speed. The FeRAM has a limit in microfabrication for achieving high integration, and also has a problem in terms of manufacturing process. The MRAM has a problem of power consumption.

Accordingly, a new type of memory element, which is advantageous particularly for the limit in the microfabrication of a memory element, has been proposed. This memory element has a structure in which an ionic conductor containing a certain metal is sandwiched between two electrodes. In this memory element, either one of the two electrodes includes the metal contained in the ionic conductor. Thus, when a voltage is applied between the two electrodes, the metal included in the electrode diffuses as an ion into the ionic conductor. Thereby, an electrical characteristic such as a resistance value or capacitance of the ionic conductor is changed. For example, Patent Document 1 and Non Patent Document 1 each describes a configuration of a memory device utilizing this property. In particular, Patent Document 1 proposes a configuration in which an ionic conductor consists of a solid solution of chalcogenide and a metal. Specifically, it consists of a material in which Ag, Cu, and Zn form a solid solution in AsS, GeS, and GeSe, and either one electrode of two electrodes contains Ag, Cu, and Zn.

Patent Document 1: Japanese unexamined PCT publication No. 2002-536840
Non Patent Document 1: NIKEEI ELECTRONICS, the issue of Jan. 20, 2003 (page 104)

SUMMARY

However, the memory elements having the configurations described above each has a problem that the resistance value changes and information is not retained when it is left for a long period of time or is left in a temperature atmosphere which is higher than room temperature, in a stored state (e.g., "1") in which the resistance value of the ionic conductor is low in resistance or in an erased state (e.g., "0") in which it is in high in resistance value. In a case where performance for retaining information is low as previously described, device characteristics are insufficient to be used in the nonvolatile memory.

In addition, when not only the resistance values of merely the high-resistance state "0" and the low-resistance state "1" are retained but also, for example, resistance values of optional values which are intermediate between a high-resistance state which is in several-hundred $M\Omega$ and a low-resistance state which is in several-hundred $k\Omega$ can be retained, not only an operational margin widens but also multi-valued recording is possible, in order to perform large capacity recording per same area. Specifically, information of 2 bit/element can be stored when 4 resistance states can be stored, and information of 3 bit/element can be stored when 16 resistance states can be stored. Thus, capacities of the memory can be improved 2 times and 3 times, respectively.

However, in an existing memory element, the resistance value capable of being retained in the low-resistance state is approximately 10 $k\Omega$ or less and the resistance value capable of being retained in the high-resistance state is approximately 1 $M\Omega$ or more, when a variable range of the resistance value is from several $k\Omega$ to several 100 $M\Omega$ for example. Thus, there has been a problem that retaining of the intermediate resistance values between the high-resistance state and the low-resistance state is difficult, and thus realization of the multi-valued memory is difficult.

The present invention has been made in view of the above-described problem, and an object of the present invention is to provide a memory element and a memory device, in which performance for retaining a resistance value in a high-resistance state (erased state) in particular improves and multi-valued memory is possible, having a suitable property for achieving large capacity, and which is superior also in a retaining property of the resistance value in high speed operation.

A memory element according to the present invention has a memory layer including an ion source layer between a first electrode and a second electrode, and stores information by a change in an electrical characteristic (for example, a resistance value) of the memory layer, and the ion source layer contains Al (aluminum), together with an ion conductive material and a metal element to be ionized.

A memory device according to the present invention is provided with a plurality of memory elements each having a memory layer including an ion source layer between a first electrode and a second electrode and storing information by a change in an electrical characteristic of the memory layer, and pulse applying means for applying a pulse of a voltage or a current to the plurality of memory elements selectively, and utilizes the memory element according to the present invention described above as the memory elements.

In the memory element or the memory device according to the present invention, a conductive path of the metal element to be ionized is formed on the first electrode side when the voltage pulse or the current pulse in a "positive direction" (for example, a negative potential on the first electrode side and a positive potential on the second electrode side) is applied to the element in an initial state (a high-resistance state), and it becomes a low-resistance state. When the voltage pulse is applied to the element in the state of the low-resistance in a "negative direction" (for example, the positive potential on the first electrode side and the negative potential on the second electrode side), the conductive path described above is oxidized and the metal element dissolves in the ion source layer, and it changes to the state of the high-resistance.

Here, in a case where an anode electrode (the second electrode) is biased to a lower potential by erasing operation, Al included in the ion source layer does not dissolve in the ion source layer but is oxidized at an interface between the ion source layer which behaves in a solid electrolyte-like manner and the anode, and forms a chemically-stable oxide film. Thereby, a retaining performance in an erased state (the high-resistance state) is improved, and a favorable retaining property is obtained in any resistance value range. Also, a change and deterioration in device characteristics in a case in which writing and erasing cycles are repeated are reduced. Meanwhile, Mg may be added in place of Al.

According to the memory element or the memory device of the present invention, Al (aluminum) is contained in the ion source layer together with the ion conductive material and the metal element to be ionized. Therefore, the retaining performance of the resistance value in the high-resistance state (the erased state) improves in particular. In addition, since the retaining property of the resistance value improves, an intermediate state between the high-resistance state and the low-resistance state can be generated, by adjusting, for example, an erasing voltage at the time when it is changed from the low-resistance state to the high-resistance state. Therefore, multi-valued memory is possible, and it is possible to realize large-capacity. Moreover, since long-repetition is possible and short-pulse high-speed driving operation is possible, it exhibits an effect that it is superior also in the retaining property of the resistance value in high speed operation.

Additional features and advantages of the present invention are described in, and will be apparent from, the following Detailed Description and the Figures.

DETAILED DESCRIPTION

One embodiment of the present invention will be hereinafter described.

Figure 1:
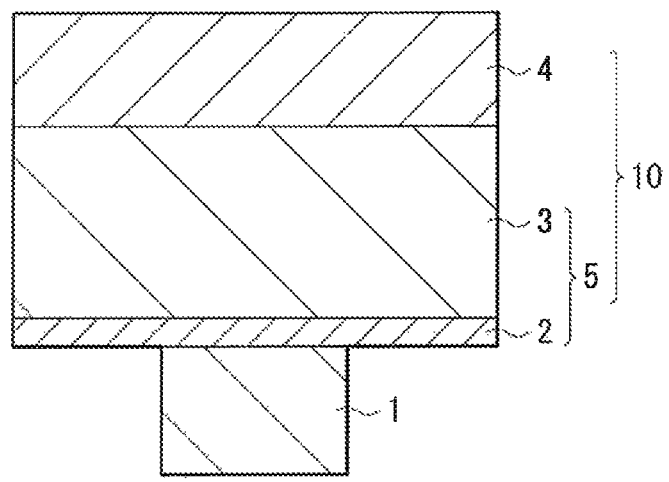
FIG. 1 A cross-sectional view illustrating a structure of a memory element according to one embodiment of the present invention.

FIG. 1 is a cross-sectional configuration view of a memory element 10 according to one embodiment of the present invention. The memory element 10 has a memory layer 5 between a lower electrode 1 and an upper electrode 4. Here, the lower electrode 1 is provided above a silicon substrate 11 on which a CMOS (Complementary Metal Oxide Semiconductor) circuit is formed, and is a connection section to a CMOS circuit part, as will be described later (FIG. 2) for example.

For the lower electrode 1, a wiring material used in a semiconductor process, such as W (tungsten), WN (tungsten nitride), Cu (copper), Al (aluminum), Mo (molybdenum), Ta (tantalum), and silicide for example can be used. Also, when a material having a possibility that ion-conduction may occur in an electrical field such as Cu is used, an electrode of Cu or the like may be coated with a material in which the ion-conduction, thermal diffusion and so on are less likely to occur, such as W, WN, TiN (titanium nitride), and TaN (tantalum nitride).

The memory layer 5 is structured with a high-resistance layer 2 and an ion source layer 3 which are stacked from the lower electrode 1 side. The ion source layer 3 contains, for example, Al (aluminum) as an additive element for forming an oxide at the time of erasure (at the time of high-resistance), together with an ion conductive material and a metal element to be ionized.

An example of the ion conductive material (negative ion element) includes a chalcogenide element such as S (sulfur), Se (selenium), and Te (tellurium), and it may be one of, or a combination of two or more of those elements.

The metal element to be ionized is reduced on a cathode at the time of writing operation to form a conductive path (filament) in a metal state. An element which is more chemically stable when it exists in the metal state within the ion source layer 3 containing the above-described S, Se, Te is desirable therefor. For example, transition metal elements of groups 4A, 5A, and 6A on the periodic table, i.e., Ti (titanium), Zr (zirconium), Hf (hafnium), V (vanadium), Nb (niobium), Ta (tantalum), Cr (chromium), Mo (molybdenum), and W (tungsten), are preferable. One of those elements is sufficient, although two or more of the metal elements may be combined.

In addition to those transition metal elements, an element such as Cu (copper), Ni (nickel), Ag (silver), and Zn (zinc) for example may be included. Here, when Cu for example is added to the transition metal element to be used, it is desirable that a ratio of the transition metal element to Cu in the ion source layer 3 described below be larger than 0.15.

(Composition ratio of transition metal element in atomic %)/{(Composition ratio of Cu in atomic %)+(Composition ratio of transition metal element in atomic %)}

This is because a retaining property is favorable when it is larger than 0.15, whereas the retaining property on the erasure side decreases when it is equal to or less than 0.15, as will be described later.

The additive element Al included in the ion source layer 3 forms an oxide when the memory element 10 changes from a low-resistance state to a high-resistance state. Specifically, it does not dissolve in the ion source layer 3 but is oxidized at an interface between the ion source layer 3, which behaves in a solid electrolyte-like manner, and an anode, and becomes a chemically-stable oxide film (Al oxide film), when the anode electrode (second electrode) is biased to a lower potential by erasing operation. Thereby, according to the present embodiment, a retaining performance in an erased state (high-resistance state) is improved, and a favorable retaining property is achieved in any resistance value range. Also, a change and deterioration in device characteristics are suppressed even when writing and erasing cycles are repeated for a long period.

An element which acts similarly to Al and which is oxidized at the interface between the ion source layer 3 and the anode to create the stable oxide film, such as Ge (germanium), Mg (magnesium), and Si (silicon) for example, may be contained in the ion source layer 3, although it is desirable that Al be at least included therein.

A content of Al in the ion source layer 3 is preferably between 20 atomic % and 60 atomic % both inclusive. This is because, when it is less than 20 atomic %, an effect of improving the retaining property in a high-resistance region and an effect of improvement in a repetitive property may be reduced. This is also because, when it exceeds 60 atomic %, movement of Al ions is more likely to occur and thus the written state is generated by reduction of the Al ions, and also, Al is low in stability in the metal state within a solid electrolyte of chalcogenide and thus the retaining property in the low-resistance written state is decreased.

The ion source layer 3, specifically, is ZrTeAl, TiTeAl, CrTeAl, WTeAl, and TaTeAl, for example. In addition, it may be CuZrTeAl in which Cu is added to ZrTeAl, CuZrTeAlGe in which Ge is further added, and moreover, CuZrTeAlSiGe in which the additive element is added, for example. Alternatively, it may be ZrTeMg in which Mg is used as the element which forms the oxide layer at the time of erasure, instead of Al. Similar additive element can be used even when other transition metal element such as Ti and Ta is selected, instead of Zr, as the metal element to be ionized. For example, it can be TaTeAlGe, and so forth. Furthermore, S, Se or I (iodine) may be used other than Te as the ion conductive material. Specifically, it can be readily analogized that an effect of the present invention is obtained even when ZrSAl, ZrSeAl, ZeIAl and so forth are used. Ge, Si, or Mg may also be used in this case.

For the high-resistance layer 2, any substance can be used as long as it is an insulator or a dielectric which is stable even when it contacts with the ion source layer 3. Preferably, an oxide or a nitride including at least one of a rare-earth element such as Gd (gadolinium), Al, Mg, Ta, Si and Cu, or the like is preferred. For example, in a case in which it is structured by the oxide of the rare-earth element, a resistance value of the high-resistance layer 2 can be adjusted by a thickness thereof, an amount of oxygen included therein, and so forth. Although the high-resistance layer 2 is not essential in the present invention, it is preferable that the high-resistance layer 2 be provided in order to stabilize the retaining property of information. In such a case, it is formed such that it contacts with the lower electrode 1 side as illustrated in FIG. 1. Meanwhile, the resistance value of the ion source layer 3 can be adjusted by an erasing current and voltage in a case in which the high-resistance layer 2 is not formed.

For the upper electrode 4, the known semiconductor wiring materials can be used, as in the lower electrode 1.

In the memory element 10 of the present embodiment, an electrical characteristic, for example the resistance value, of the memory layer 5 is changed when a voltage pulse or a current pulse is applied from a not-illustrated power source (pulse applying means) through the lower electrode 1 and the upper electrode 4 described above, and thereby storing, erasing, and further, reading of the information are performed. Hereinafter, operation thereof will be described specifically.

First, a positive voltage is applied to the memory element 10 such that, for example, the upper electrode 4 is at a positive potential and the lower electrode 1 side is at a negative potential. Here, in a case where the transition metal element Zr is used as the metal element to be ionized for example, a positive ion of Zr is ion-conducted from the ion source layer 3, and is coupled with an electron on the lower electrode 1 side to be deposited. As a result, the low-resistance conductive path (filament) of Zr, reduced in the metal state, is formed at an interface between the lower electrode 1 and the memory layer 5, or the conductive path is formed in the high-resistance layer 2. Thus, the resistance value of the memory layer 5 is reduced, and it changes from the high-resistance state as an initial state to the low-resistance state.

The low-resistance state is retained even when the positive voltage is removed to eliminate the voltage applied to the memory element 10 thereafter. The information is thereby recorded. The recording completes only with the recording process described above, in a case where it is used for a memory device in which recording is possible only once, or a so-called PROM (Programmable Read Only Memory). On the other hand, an erasing process is required for application of a memory device in which erasure is possible, i.e., such as for RAM (Random Access Memory), EEPROM (Electronically Erasable and Programmable Read Only Memory), or the like. In the erasing process, a negative voltage is applied to the memory element 10 such that, for example, the upper electrode 4 is at the negative potential and the lower electrode 1 side is at the positive potential. Thereby, Zr of the conductive path formed in the memory layer 5 is oxidized and ionized, and is dissolved in the ion source layer 3 or is coupled with Te or the like. Thus, the Zr conductive path disappears and an oxide (insulating layer) of Al included in the ion source layer 3 is formed, and the resistance value is consequently increased.

The state in which the resistance value is increased is retained even when the negative voltage is removed to eliminate the voltage applied to the memory element 10 thereafter. Thereby, erasure of the information recorded therein is possible. The recording (writing) of the information and the erasure of the recorded information can be repeatedly performed to the memory element 10 by repeating such processes.

Further, when the state in which the resistance value is high is associated with information of "0" and the state in which the resistance value is low is associated with information of "1" respectively for example, it can be changed from "0" to "1" in the recording process of information by the application of the positive voltage, and it can be changed from "1" to "0" in the erasing process of information by the application of the negative voltage. The resistance value after the recording is dependent on recording conditions such as a width of the voltage pulse or the current pulse, an amount of current applied at the time of the recording and so forth, rather than a cell size of the memory element 10 and a material composition of the high-resistance layer 2, and is in a range of from approximately several k$\Omega$ to 100 M$\Omega$ in a case in which an initial resistance value is 100 M$\Omega$ or more.

It is more preferable as a ratio of the initial resistance value to the resistance value after the recording is larger, in order to demodulate recorded data. However, it is difficult to perform the writing, i.e., to make it low-resistance and thus a writing threshold voltage becomes too large when the resistance value of the high-resistance layer is too large. Accordingly, the initial resistance value is adjusted to 1 G$\Omega$ or below. For example, in a case in which the high-resistance layer 2 is formed by the oxide of the rare-earth element, the resistance value of the high-resistance layer 2 can be controlled by the thickness thereof, the amount of oxygen included therein, and so forth. Meanwhile, it can be controlled by the erasing current and voltage in the case in which the high-resistance layer 2 is not formed.

As described above, although, in the memory element 10 of the present embodiment, the recording of the information and further, the erasing of the recorded information are possible by application of the voltage or the current pulse to the upper electrode 4 and the lower electrode 1, the retaining performance of the resistance value in any range improves as described below.

Specifically, in the present embodiment, when the writing is performed with the ion source layer 3 including Zr, that Zr acts as the ionizing element which forms the conductive path, and the conductive path consisting of the reduced Zr in the metal state is formed. Since the conductive path of Zr is relatively difficult to dissolve in the electrolyte of the chalcogenide, the low-resistance state can be easily retained when it has once changed to the written state, i.e., to the low-resistance state, as compared with a case in which, for example, the conductive path is formed by other metal element which easily dissolves in the chalcogenide electrolyte, such as Cu, Ag and so forth. Thereby, the retaining performance in the low-resistance state improves.

On the other hand, in the high-resistance state at the time of the erasure as well, since Zr is low in ion-mobility as compared with other elements such as at least Cu when Zr is dissolved again in the ion source layer as the ion (positive ion), it is less likely that it moves even when there is a rise in temperature or even when it is left for a long period, and such a case in which it is deposited in the metal state on the cathode is less likely to occur. Alternatively, since the Zr oxide is stable in the chalcogenide electrolyte and the oxide is less likely to degrade, the high-resistance state is maintained even when it is retained in a state which is higher in temperature than room temperature or is retained for a long period of time. Meanwhile, the resistance value of the ion source layer 3 excessively decreases and thus the effective voltage cannot be applied to the ion source layer 3, or it is difficult to dissolve Zr in the chalcogenide layer, when an amount of Zr is too large. Thus, the erasure becomes difficult to be carried out in particular, and a threshold voltage for the erasure increases in accordance with the additive amount of Zr, and further, the writing, i.e., make it low-resistance, becomes also difficult when it is too excessive. On the other hand, when the additive amount of Zr is too little, an effect of improving the retaining property of the resistance value in any range described above is reduced. Therefore, a content of Zr in the ion source layer 3 is preferably equal to or more than 3 atomic %, and is more preferably between 3 atomic % and 40 atomic % both inclusive.

Further in the present embodiment, since Al is included in the ion source layer 3, the high-resistance layer including Al (Al oxide) is formed on the anode in the erasing operation. Since the Al oxide is chemically stable in the solid electrolyte of the chalcogenide, it does not react with other element and is not destroyed. Thus, the high-resistance state is easily maintained, and the high-resistance state is easily retained even when retaining and high-temperature-retaining-acceleration tests are performed. Meanwhile, if, for example, an oxide of Cu or Ag is formed on the anode by the erasing operation, the bias which applies the lower potential to the anode will not be applied, and the high-resistance oxide will presumably react with the chalcogenide when it becomes an information retaining mode. Thus, the high-resistance state is difficult to be retained.

Therefore, the present embodiment has the property capable of retaining the resistance value of any range. Thus, by adjusting, for example, the erasing voltage at the time when it is caused to operate from the low-resistance state to the high-resistance state to generate an intermediate state between the high-resistance state and the low-resistance state, the resistance value thereof can be retained. Hence, it is possible to realize multi-valued memory.

In addition, although, in the present embodiment, Zr and Al exist in a state of the positive ion within the ion source layer 3, Al plays a role like a reducing agent to promote the reduction of Zr since Zr is easier to be reduced than Al on the cathode in the writing operation. Therefore, operating speed for the writing improves significantly. On the other hand, since Zr conversely acts as an oxidizing agent of a case in which Al is oxidized to form the high-resistance layer in a case of the erasing operation, an oxidization reaction of Al is accelerated, and thus operating speed improves.

Accordingly, in the present embodiment, the operating speeds of the writing and the erasing are improved prominently, and the writing operation and the erasing operation are easy as described above. Therefore, unnecessary movement of ion due to the writing and erasing cycles does not occur, and element-segregation in the ion source layer 3 or the like does not occur and thus cycle characteristics also improve.

Meanwhile, although the content of Al in the ion source layer 3 is preferably between 20 atomic % and 60 atomic % both inclusive, other elements other than Al can also be added for the purpose of suppressing peeling-off of film at the time of high-temperature heat treatment of the memory layer 5, and so on. For example, Ge or Si is an additive element to which the improvement in the retaining property can also be expected simultaneously, and is suitable to be used together with Al in the ion source layer 3. For example, Ge is effective for further improving a cycle resistance, although, on the other hand, those elements reduce the retaining property in the writing when an additive amount is too large. Although its mechanism is not necessarily certain, it can be considered presumably that it has an effect of promoting the reaction by which the high-resistance layer is formed in the erasing operation, and suppressing diffusion of unnecessary element by cycle operation. In addition, a retaining property of data and high speed operability decrease when the additive amount in this case is too large. Therefore, it is desirable that a total additive amount with Al be in the range of between 20 atomic % and 60 atomic % both inclusive, even in the case in which Ge or Si is used as the additive element.

Hereinafter, a method of manufacturing the memory element 10 according to the present embodiment will be described.

First, the lower electrode 1, consisting of W for example, is formed on the substrate on which the CMOS (Complementary Metal Oxide Semiconductor) circuit such as selection transistors is formed. Thereafter, an oxide or the like on a surface of the lower electrode 1 is removed by a reverse sputtering or the like if necessary. Then, the high-resistance layer 2 consisting of a Gd oxide is formed. For example, a Gd target is used to deposit a metal Gd film at a film-thickness of 1 nm, and is thereafter oxidized by oxygen plasma. Then, the ion source layer 3, which is a ZrTeAl film for example, is formed by DC magnetron sputtering. Then, a W (tungsten) film for example is deposited as the upper electrode 4. In this manner, a laminated film is formed.

Subsequently, the high-resistance layer 2, the ion source layer 3, and the upper electrode 4 in respective layers of the laminated film are patterned by plasma etching or the like. Other than the plasma etching, the patterning may be performed by using an etching method such as ion milling, RIE (Reactive Ion Etching: reactive ion etching) and so forth. Then, a wiring layer is formed to provide connection to the upper electrode 4, and all of the memory elements 10 and contact portions for obtaining a common potential are connected. Then, a heat treatment is applied to the laminated film. In this manner, the memory element 10 can be manufactured.

Accordingly, in the memory element 10 according to the present embodiment, Zr and Al are included, besides the chalcogen element, in the ion source layer 3. Therefore, it is superior in the retaining property of information. In addition, it is possible to retain the information even when current driving force of transistors become small in a case in which microfabrication is performed. Therefore, increase in density and reduction in size can be achieved by structuring the memory device by using the memory element 10. Also, respective layers of the lower electrode 1, the high-resistance layer 2, the ion source layer 3, and the upper electrode 4 can be structured by a material to which the sputtering can be performed, respectively. Therefore, a manufacturing process is also simplified. Specifically, targets consisting of compositions suitable for materials of the respective layers, respectively, may be used to sequentially perform the sputtering. In addition, it is also possible to perform deposition successively in the same sputtering system by changing the targets.

The memory device (memory) can be structured by arranging a plurality of the above-described memory elements 10 in column or in matrix for example. At this time, each of the memory elements 10 may be connected with a MOS transistor for element-selection or with a diode to structure a memory cell, and may be further connected to a sense amplifier, an address recorder, a recording-erasure-reading circuit and so forth through wiring, as necessary.

Figure 2:
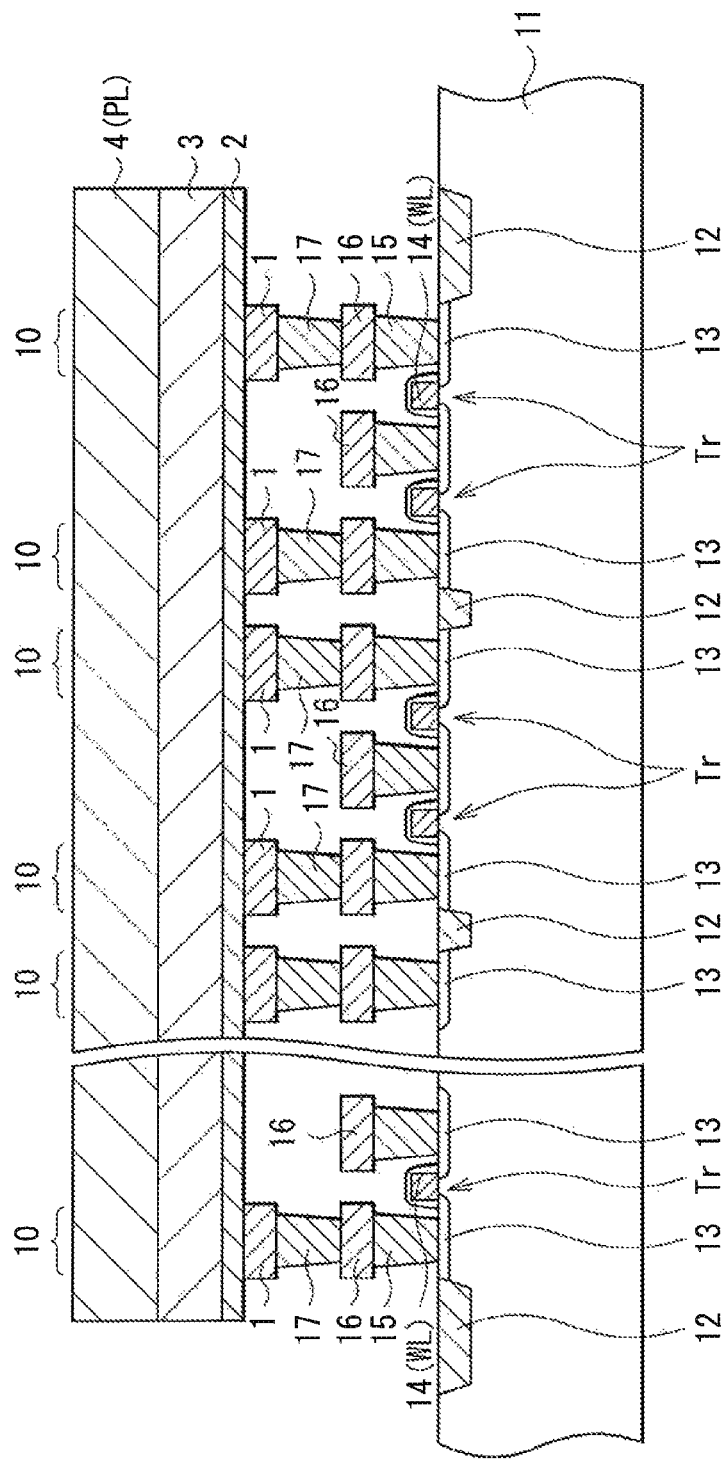
FIG. 2 A cross-sectional view illustrating a schematic structure of a memory cell array in which the memory element of FIG. 1 is used.
Figure 3:
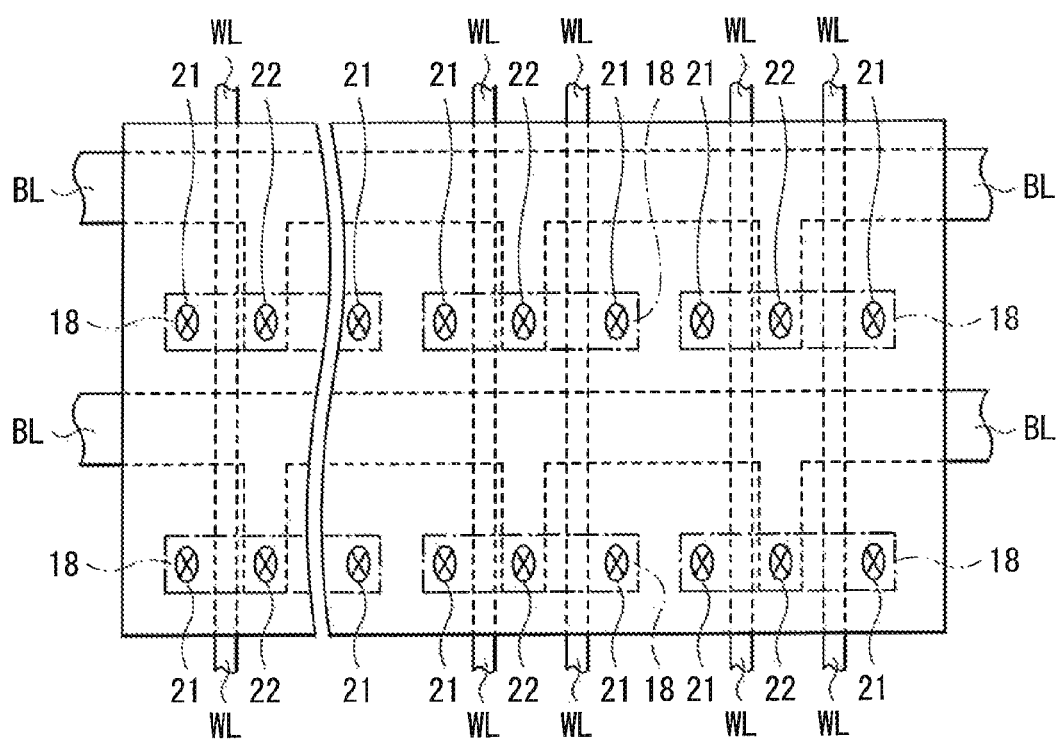
FIG. 3 A plan view of the same memory cell array.

FIG. 2 and FIG. 3 illustrate one example of the memory device (memory cell array) in which the plurality of memory elements 10 are disposed in matrix, wherein FIG. 2 and FIG. 3 illustrate a cross-sectional configuration and a planar configuration, respectively. In this memory cell array, each of the memory elements 10 is provided with a wire connected to the lower electrode 1 side thereof, and a wire connected to the upper electrode 4 side thereof, which are provided to intersect one another, and each of the memory elements 10 is disposed for example in the vicinity of the intersection of those wires. In addition, wiring connected on the upper electrode 4 side is formed in common on the entire array.

More specifically, each of the memory elements 10 shares the respective layers of the high-resistance layer 2, the ion source layer 3, and the upper electrode 4. In other words, each of the high-resistance layer 2, the ion source layer 3, and the upper electrode 4 is structured by a layer common to each of the memory elements 10 (identical layer). Among those, the commonly-formed upper electrode 4 is a plate electrode PL. On the other hand, the lower electrode 1 is formed individually for each memory cell. Thereby, each of the memory cells is electrically separated. The memory element 10 of each of the memory cells is defined by the lower electrode 1, provided for each of the memory cells, at a position corresponding to each lower electrode 1. Each of the lower electrodes 1 is connected to a corresponding cell-selection MOS transistor Tr, and each of the memory elements 10 is formed above the MOS transistor Tr. The MOS transistor Tr is structured with a source/drain region 13 formed in a region separated by an element separating layer 12 in the semiconductor substrate 11, and a gate electrode 14. A wall surface of the gate electrode 14 is formed with a side wall insulating layer. The gate electrode 14 also serves as a word line WL which is one of address wires of the memory element 10. One of the source/drain regions 13 of the MOS transistor Tr and the lower electrode 1 of the memory element 10 are electrically connected through a plug layer 15, a metal wiring layer 16, and a plug layer 17. The other of the source/drain regions 13 of the MOS transistor Tr is connected with the metal wiring layer 16 through the plug layer 15. The metal wiring layer 16 is connected with a bit line BL (see FIG. 3) as the other of the address wires of the memory element. In FIG. 3, note that an active region 18 of the MOS transistor Tr is indicated by a chained line. A contact portion 21 is connected with the lower electrode 1 of the memory element 10, and a contact portion 22 is connected with the bit line BL, respectively.

In this memory cell array, when a gate of the MOS transistor Tr is turned to an on-state by the word line WL to apply a voltage to the bit line BL, a voltage is applied to the lower electrode 1 of the selected memory cell through the source/drain of the MOS transistor Tr. Here, in a case where a polarity of the voltage applied to the lower electrode 1 is at a negative potential as compared with a potential of the upper electrode 4 (plate electrode PL), the resistance value of the memory element 10 transits to the low-resistance state as described above. Thereby, information is recorded in the selected memory cell. Next, when the voltage which is at a positive potential as compared with the potential of the upper electrode 4 (plate electrode PL) is applied to the lower electrode 1, the resistance value of the memory element 10 transits again to the high-resistance state. Thereby, the information recorded in the selected memory cell is erased. To perform the reading of the recorded information, a memory cell is selected by the MOS transistor Tr and a predetermined voltage or current pulse is applied to that cell. A current or voltage, which is different in accordance with the resistance state of the memory element 10 at this time, is detected by the sense amplifier or the like connected to the bit line BL or to an end of the plate electrode PL. Meanwhile, the voltage or the current applied to the selected memory cell is configured to be smaller than a threshold value such as a voltage in which the state of the resistance value of the memory element 10 transits.

The memory device according to the present embodiment can be applied to various memory devices as mentioned above. It is applicable to any memory mode, such as so-called PROM (Programmable Read Only Memory) in which writing is possible only once, EEPROM (Erasable Programmable Read Only Memory) in which the erasing is electrically possible, or so-called RAM in which the recording, the erasing, and the reproducing are possible at high speed, for example.

EXAMPLES

Hereinafter, specific Examples of the present invention will be described.

Example 1

As illustrated in FIG. 2 and FIG. 3, the MOS transistor was first formed on the semiconductor substrate 11. Then, an insulating layer was formed to cover a surface of the semiconductor substrate 11, and a via-hole was formed on the insulating layer. Subsequently, the inside of the via-hole was filled with an electrode material consisting of W (tungsten) with a CVD (Chemical Vapor Deposition) method, and a surface thereof was planarized with a CMP (Chemical Mechanical Polishing) method. In addition, these processes were repeated to form the plug layer 15, the metal wiring layer 16, the plug layer 17, and the lower electrode 1, and further, the lower electrode 1 was patterned for each memory cell. A size of an opening of the lower electrode 1 was configured with a diameter of 300 nm. Then, etching was performed by about 1 nm with reverse sputtering utilizing a RF power source, in order to remove an oxide on an upper surface of the lower electrode 1. At this time, a surface of the lower electrode 1 was planarized such that the surface has a height virtually same as that of the surrounding insulating layer. Then, the metal Gd film having a film-thickness of 1.0 nm was formed with DC magnetron sputtering, and further, the Gd film was oxidized for 10 seconds with RF plasma, with conditions of input power of 500 W and an atmosphere of $O_2$ under a chamber pressure of 1 mTorr. This Gd oxide was provided as the high-resistance layer 2.

Then, the ZrTeAl film was deposited as the ion source layer 3 on the high-resistance layer 2 to 45 nm. A composition thereof was Zr 20%-Te 40%-Al 40% (atomic %). Moreover, a W film was formed on the ion source layer 3 to a film-thickness of 20 nm as the upper electrode 4. Moreover, a W film was formed as the upper electrode 4 on the ion source layer 3 to a film-thickness of 20 nm. Thereafter, the high-resistance layer 2, the ion source layer 3, and the upper electrode 4, which were formed thoroughly on the semiconductor substrate 11, were patterned such that they remain throughout the entire memory part to form the memory element 10 illustrated in FIG. 1, and a surface of the upper electrode 4 was etched to expose a contact part to be connected with an external circuit for applying an intermediate potential (Vdd/2). Further, a wiring layer (Al layer) having a thickness of 200 nm was so formed as to be connected to the exposed contact part. Subsequently, a heat treatment was applied in a vacuum heat treatment furnace for 2 hours at a temperature of 300° C. In this manner, the memory cell array illustrated in FIG. 2 and FIG. 3 was fabricated to provide it as the Example 1.

As below, memory cell arrays, each consisting of the memory element similar to that of the Example 1 except for the ion source layer 3, were fabricated to provide them as Examples 2 to 19 and Comparative Examples 1 to 4, respectively.

Comparative Examples 1 and 2

In the Example 1, Zr was used as the metal element to be ionized for the ion source layer 3. In the Comparative Example 1, Cu was used as the metal element to be ionized without using Al and Zr, and Si was used as the element which forms the oxide film in the erasing operation, to have a composition thereof: Cu—Te—Si. In the Comparative Example 2, Cu and Zr were used as the metal element to be ionized without using Al, and Si was used as the element which forms the oxide film in the erasing operation, to have a composition thereof: Cu—Zr—Te—Si. By comparing the Example 1 with the Comparative Examples 1 and 2, effects in the cases in which Si and Al are used for the element considered to form the high-resistance layer (oxidization layer) by the erasing operation, and a difference in operating properties of memory between the case in which Zr is used for the metal element to be ionized and the case in which Cu is used therefor were studied.

Specifically, the Comparative Examples 1 and 2 have the following compositions, and a film-thickness was 45 nm each.

Comparative Example 1: Cu 47%-Te 25%-Si 28% (atomic %)

Comparative Example 2: Cu 14%-Zr 14%-Te 27%-Si 45% (atomic %)

Examples 2 to 5

In the Examples 2 to 5, other transition metal elements Ta, Cr, Ti, and W were used as the metal element to be ionized in the ion source layer 3. The film-thickness was 45 nm each.

Example 2: Ta 20%-Te 40%-Al 40% (atomic %)
Example 3: Cr 30%-Te 30%-Al 40% (atomic %)
Example 4: Ti 30%-Te 30%-Al 40% (atomic %)
Example 5: W 15%-Zr 5%-Nb 5%-Te 35%-Al 40% (atomic %)

Examples 6 to 9, Comparative Examples 3 and 4

Films having the following composition ratios with the film-thicknesses of 45 nm were formed by using Zr as the metal element to be ionized of the ion source layer 3, respectively. Composition ratios of Al were varied from 10, 20, 30, 40, 50, and 60 to 70%, while ratios of Zr to Te were substantially constant.

Comparative Example 3: Zr 30%-Te 60%-Al 10% (atomic %)
Example 6: Zr 27%-Te 53%-Al 20% (atomic %)
Example 7: Zr 23%-Te 47%-Al 30% (atomic %)
Example 8: Zr 16%-Te 34%-Al 50% (atomic %)
Example 9: Zr 13%-Te 27%-Al 60% (atomic %)
Comparative Example 4: Zr 10%-Te 20%-Al 70% (atomic %)

Examples 10 to 15

Films having the following composition ratios with the film-thicknesses of 45 nm were formed by using Zr and Cu as the metal element to be ionized of the ion source layer 3, respectively. Ratios of Zr and Cu were each represented by a fraction ratio of Zr/(Cu+Zr), and were varied from 1, 0.69, 0.5, 0.32, and 0.15 to 0.

Example 10: Zr 16%-Te 44%-Al 40% (atomic %)
Example 11: Zr 11%-Cu 5%-Te 44%-Al 40% (atomic %)
Example 12: Zr 8%-Cu 8%-Te 44%-Al 40% (atomic %)
Example 13: Zr 10%-Cu 21%-Te 29%-Al 44% (atomic %)
Example 14: Zr 5%-Cu 28%-Te 28%-Al 39% (atomic %)
Example 15: Cu 45%-Te 23%-Al 32% (atomic %)

Examples 16 to 18

Films having the following composition ratios with the film-thicknesses of 45 nm were formed by using Zr and Cu as the metal element to be ionized of the ion source layer 3, respectively. Ge and Si were added to Al as the element which forms the oxide in the erasing operation to provide them as the Examples 16 and 17, respectively. Also, a case in which Mg was used instead of Al was provided as the Example 18.

Example 16: Zr 8%-Cu 8%-Te 44%-Al 35%-Ge 5% (atomic %)

Example 17: Zr 8%-Cu 8%-Te 44%-Al 35%-Si 5% (atomic %)

Example 18: Zr 8%-Cu 8%-Te 44%-Mg 40% (atomic %)

Example 19

The lower electrode 1 formed on the semiconductor substrate 11 having the CMOS circuit was covered with a $SiO_2$ film having a thickness of about 15 nm to provide an interlayer insulating film, in a similar manner as in the Example 1. Then, patterning utilizing electron lithography was performed to open a contact hole having a diameter of 20 nm on the interlayer insulating film. Thereafter, the ion source layer 3 having a composition of Zr 8%-Cu 8%-Te 44%-Al 40% (atomic %) was formed directly without forming the high-resistance layer 2, to fabricate a memory cell array similar to that of the Example 1, which was provided as the Example 19.

[Characteristic Evaluation]

<Experiment 1>

Figure 4:
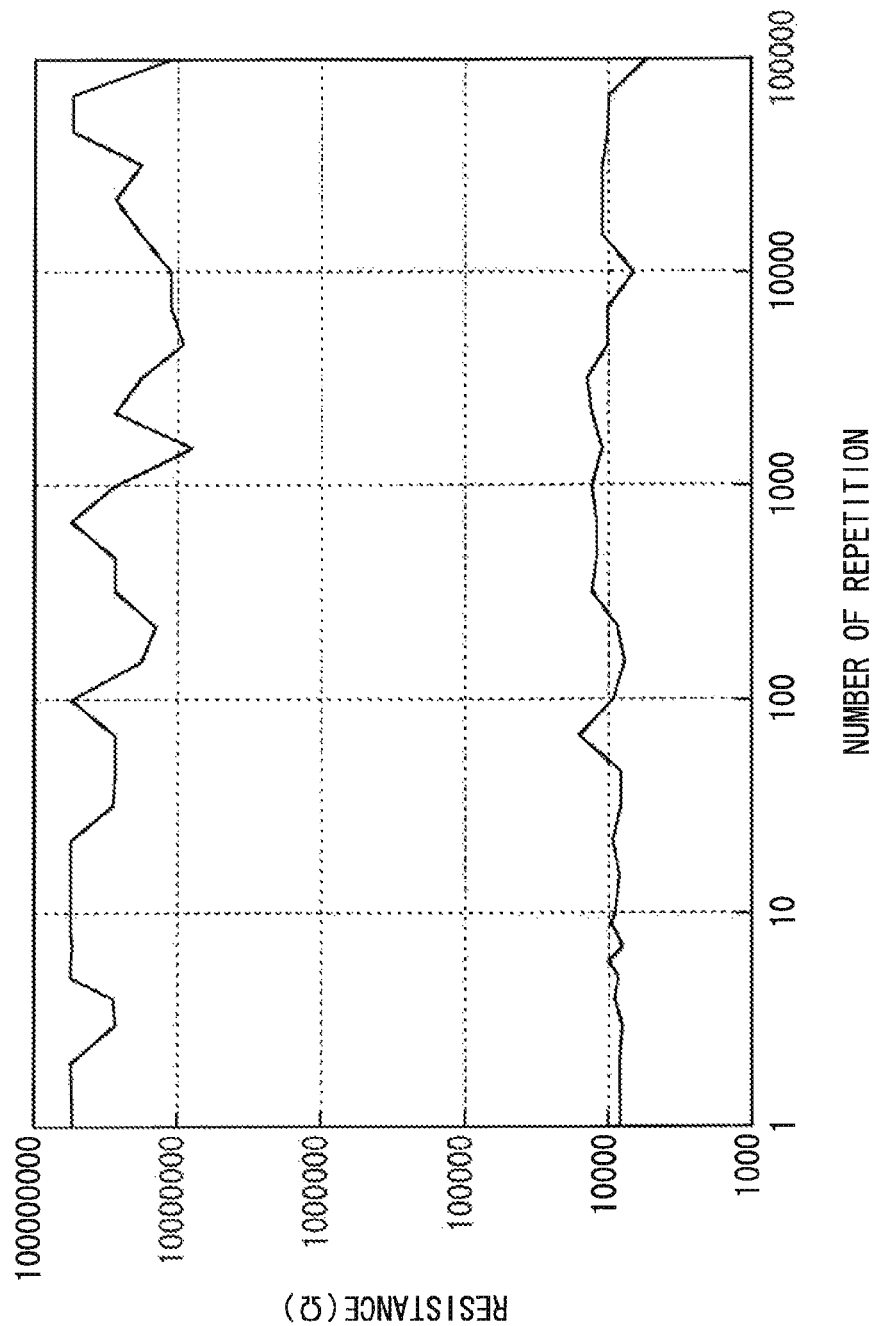
FIG. 4 A diagram representing a repetitive retaining property of a memory element in Example 1.

The "writing operation", in which an upper wire connected to the upper electrode 4 was grounded to the intermediate potential of Vdd/2, a voltage was applied to the gate electrode, i.e., the word line WL, of the a memory cell to be selected to turn it to an on-state, and 3.0 V with a pulse width of 10 μs for example was applied to an electrode, i.e., the bit line BL, which was connected to the one of the source/drains 13 of the transistor Tr that was not connected to the memory element 10 for example, was performed to a total of 20 elements having 10 elements×2 columns within a memory cell array, with respect to a cell array of the memory elements 10 according to the Example 1, and a resistance value was read thereafter. Next, 3.0 V was applied to the gate electrode to turn it to an on-state, and voltages on 0.2 V to 0.2 V basis from −0.7 V to −2.5 V were applied, for example, with a pulse width of 10 μs to the same 20 elements in total having the 10 elements×2 columns within the memory cell array to perform the "erasing operation", and a resistance value in an erased state was read. These writing and erasing operations were repeatedly performed for 1000 times to the memory cell array, to evaluate a repetitive operating property. A high speed operating property can be evaluated, for example, by narrowing the pulse width in the writing and the erasing operations. Also, one column of the 10 elements×2 columns was stopped in the written state and the remaining one column was stopped in the erased state after the repetition of 1000 times, to measure the resistance value in the written state and the erased state. Next, it was retained for 1 hour in an oven of 130° C. to perform the high-temperature-retaining-acceleration test. Thereafter, the resistance values in the written state and the erased state were read, and the resistance values before and after the high-temperature-retaining-acceleration test were compared to evaluate the retaining property of information. A repetitive property thus obtained of the memory element according to the Example 1 is as represented in FIG. 4.

Figure 5:
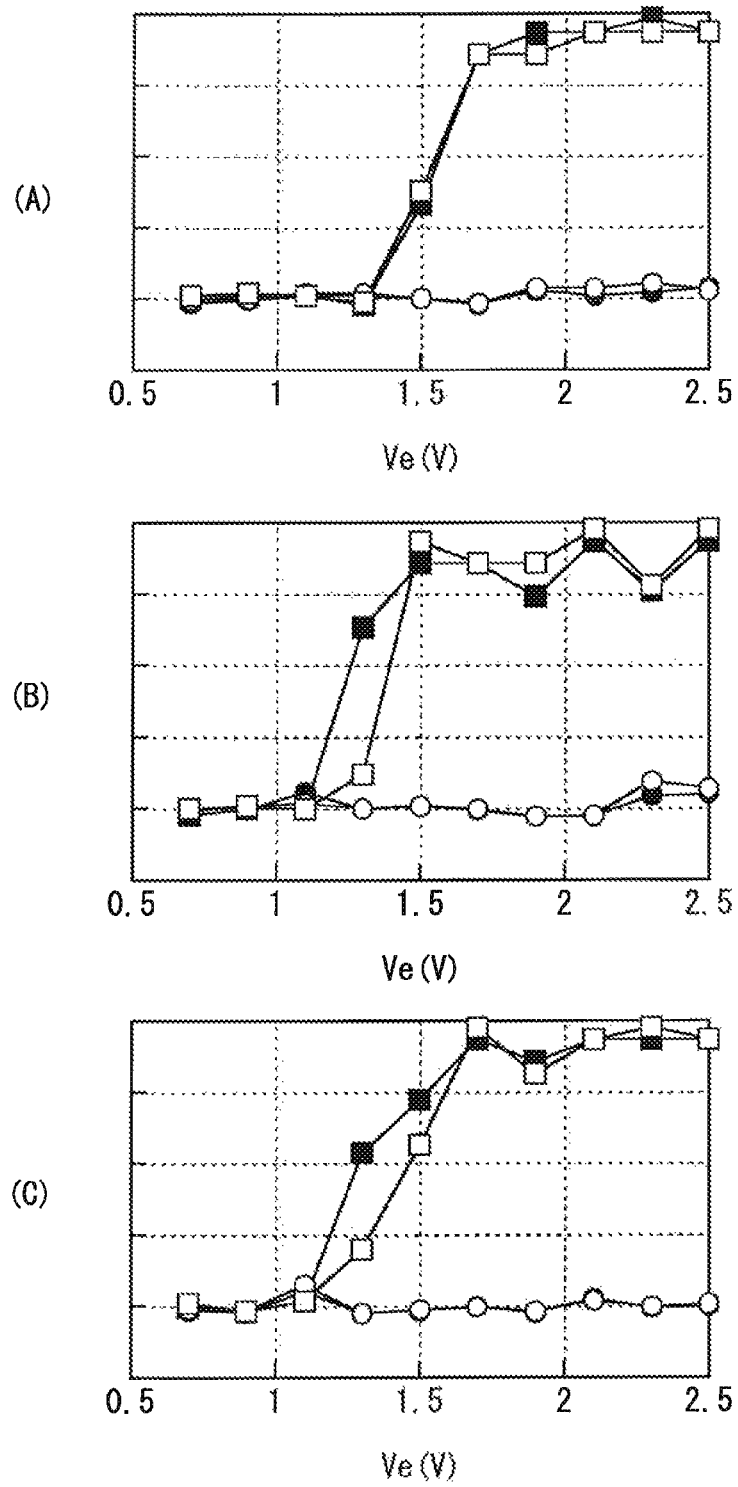
FIG. 5 Characteristic diagrams representing erasing voltage dependencies of resistance values in a written state and in an erased state in the Example 1.

Next, the erasing voltages Ve were changed from 0.7 V to 2.5 V, in which a writing voltage Vw was 3.0 V, writing gate voltages Vgw were 1.3 V and 1.8 V, and an erasing gate voltage was 3.0 V, with pulse widths of 100 ns, 1 μs and 10 μs, respectively. This was repeated for 1000 times, and thereafter, erasing voltage dependencies of the resistance values in the written state (low-resistance state) and in the erased state (high-resistance state) before and after of high temperature retaining of 130° C.-1 h were examined. The results thereof are as represented in FIGS. 5(A) to (C). A solid line indicates the resistance value before the retaining, and a dotted line indicates the resistance value after the retaining, respectively.

Figure 6:
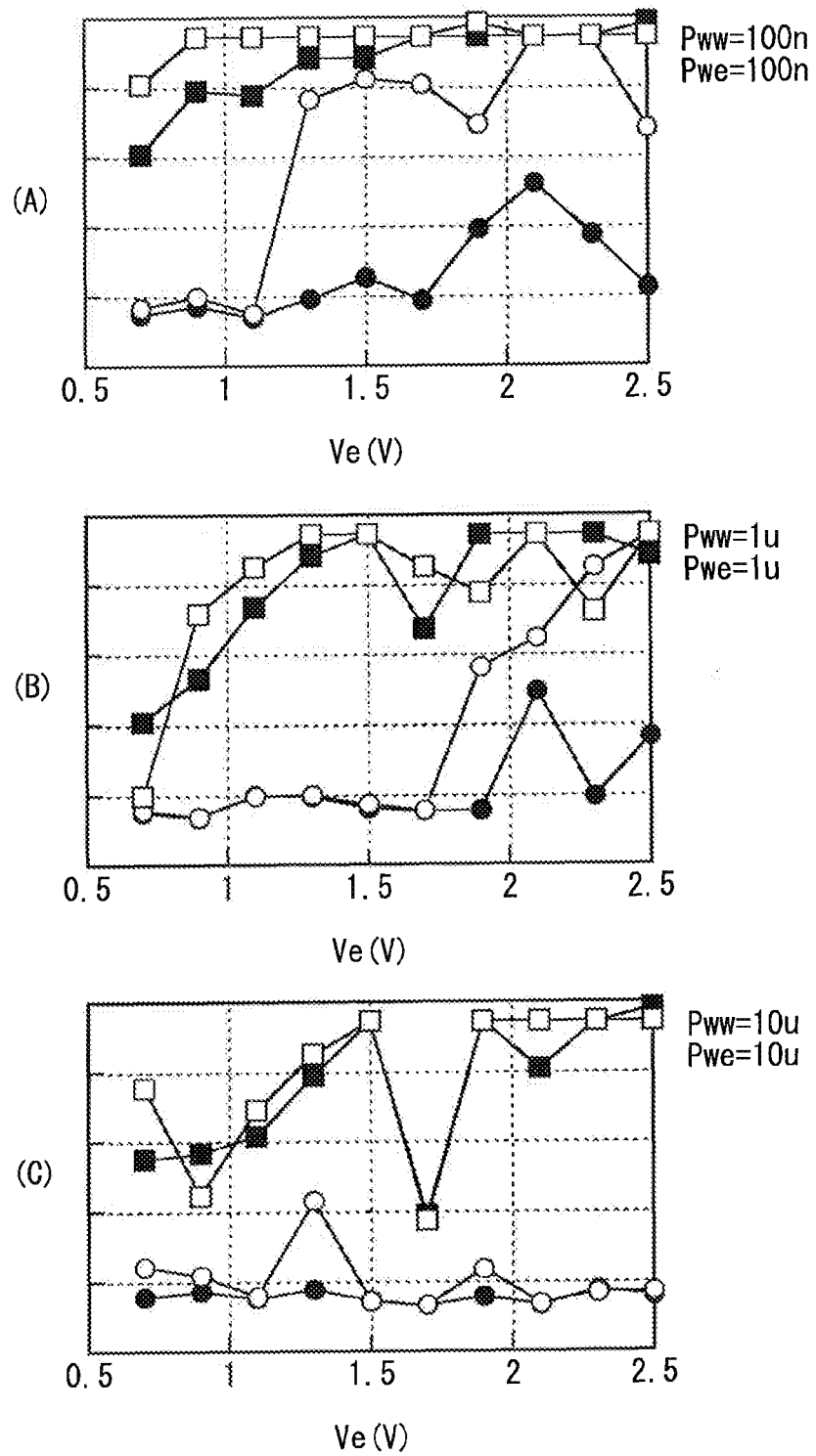
FIG. 6 Characteristic diagrams representing erasing voltage dependencies of Comparative Example 1.
Figure 7:
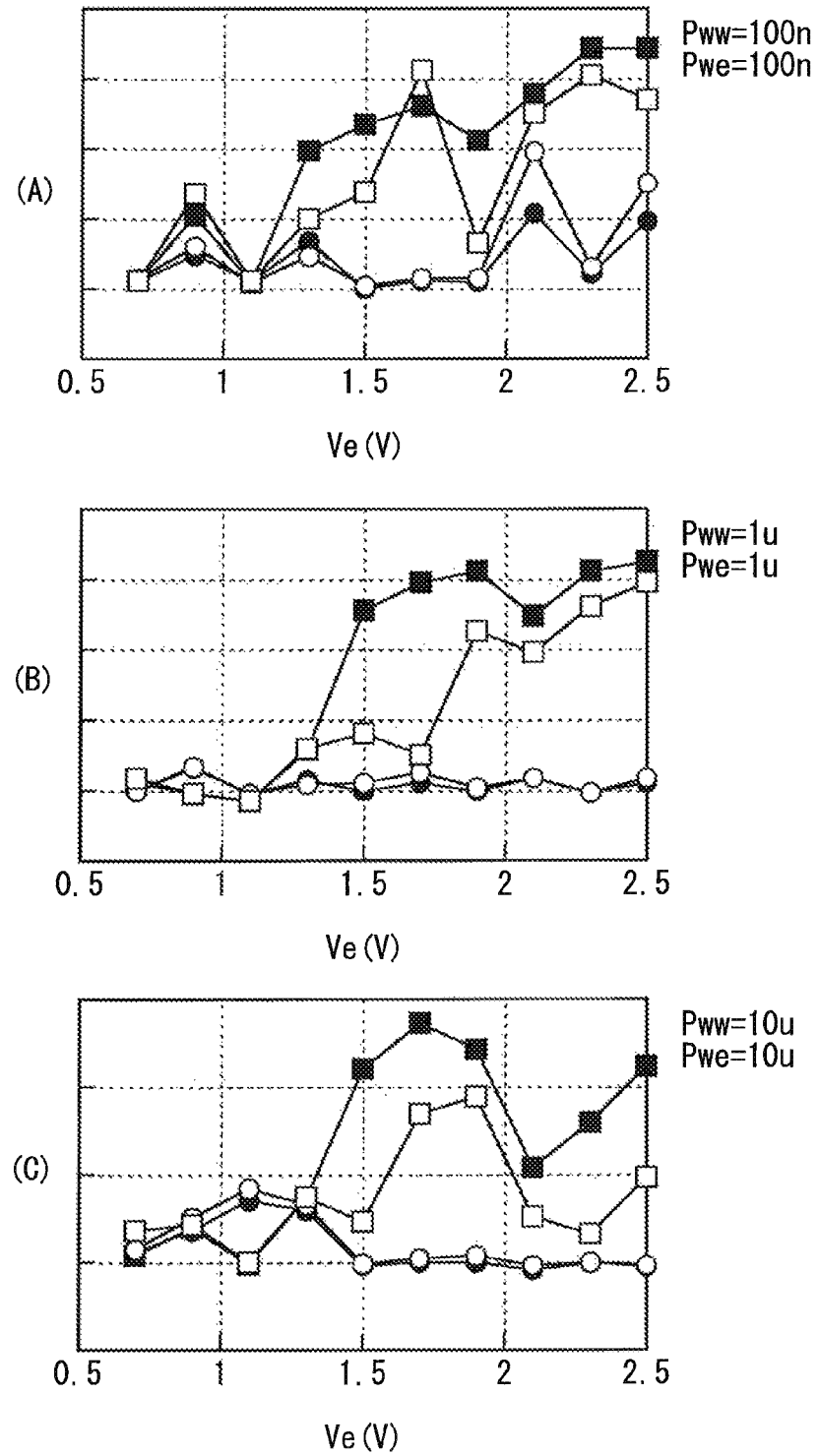
FIG. 7 Characteristic diagrams representing erasing voltage dependencies of Comparative Example 2.

Next, results of similar measurement performed by using a sample according to the Comparative Example 1, consisting of Cu—Te—Si based composition, with a similar method are as represented in FIGS. 6(A) to (C). The pulse width by which a favorable retaining property is obtained and in which the writing and the erasure, i.e. the low-resistance state and the high-resistance state, are retained is until 10 μs, and they are hardly retained when the pulse width is shortened until 100 ns. Also, FIGS. 7(A) to (C) represent results of similar measurement performed by utilizing a sample according to the Comparative Example 2 consisting of Cu—Zr—Te—Si based composition. It has a tendency that the retaining property in a short-pulse operation is superior as compared with the result of the Comparative Example 1 in which only Cu is used as an operating ion which takes a role in a memory operation, but is inferior in the retaining properties in the high-resistance state and the low-resistance state as compared with the Example 1. Meanwhile, "Pww" and "Pwe" in the figures represent the pulse width in the writing and the pulse width in the erasing, respectively.

The following can be seen from these results. Specifically, the Example 1 uses Al, and the Comparative Examples 1 and 2 each uses Si, for the element which forms the high-resistance layer (oxidization layer) in the erasure, and by including Al, the stability in the high speed operation enhances and the retaining properties in the writing and in the erasure resistance after the high speed operation are improved significantly in the Example 1. In addition, when comparing the Comparative Example 1 in which the operating ion, which takes a role in the memory operation, is Cu with the Example 1 in which it is Zr, the recording retaining property in the case in which the writing is performed with the short pulse is greatly improved in the Example 1, since Zr is contained therein. Also, when comparing the Comparative Example 2, which includes Zr but does not include Al, with the Example 1 which includes Zr and Al, the erasing property is improved in the Example 1 which includes Al.

Figure 8:
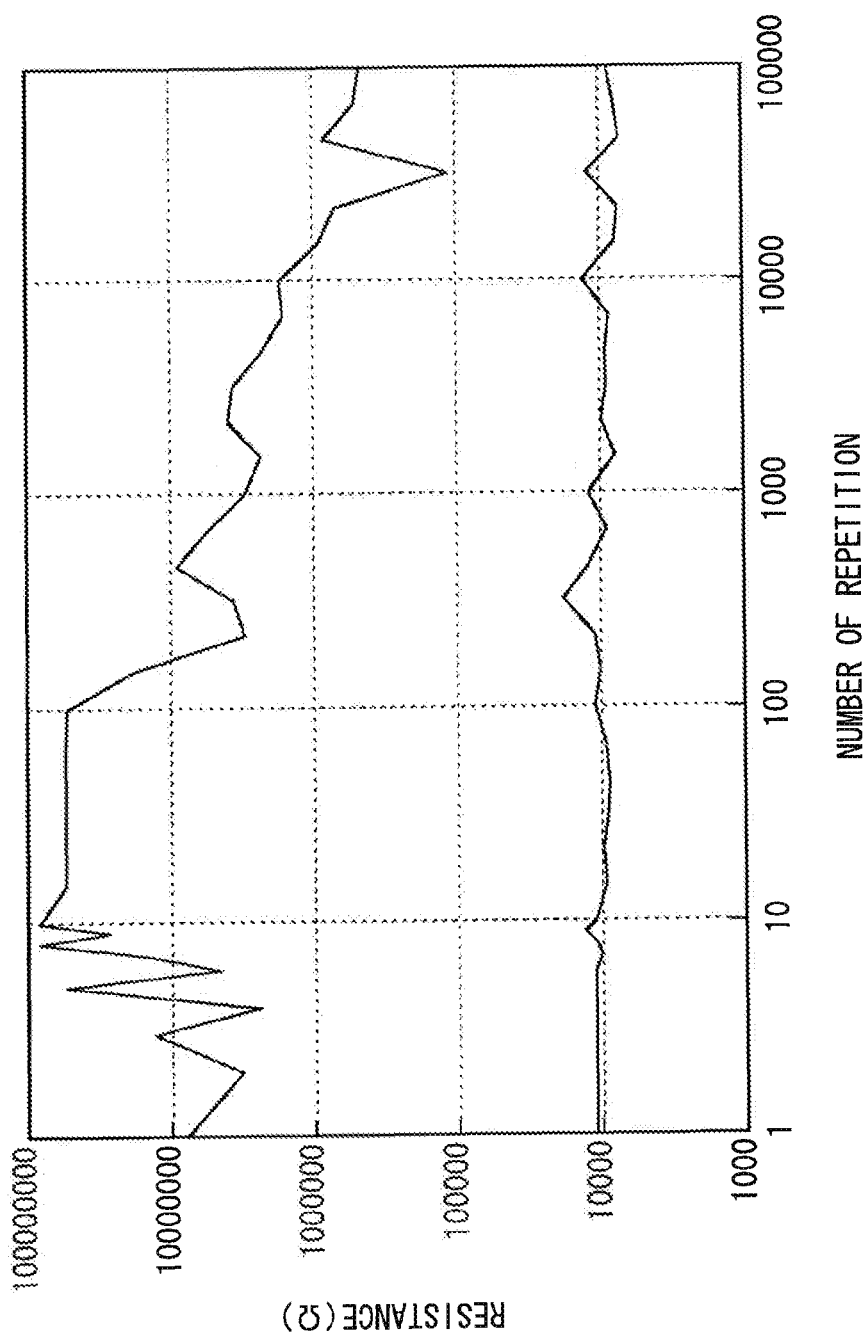
FIG. 8 A diagram representing a repetitive retaining property in the Comparative Example 1.

Also, a result of measurement of the repetitive property of the sample according to the Comparative Example 2 with the same conditions as in FIG. 4 is as represented in FIG. 8. There is a difference in the repetitive property in the Comparative Example 2 when compared with the Example 1, and deterioration is larger than the Example 1. In other words, by containing Al and further including Zr as a carrier ion in the ion source layer 3 as in the Example 1, operation at high speed is possible, and the data retaining property after the high speed operation becomes superior as well.

<Experiment 2>

The repetitive retaining properties of the Examples 2 to 5 in which Ta, Cr, Ti and a W—Zr—Nb alloy were used for the carrier ion, respectively, were measured in a similar manner as in the Example 1. Results of a case where the pulse width was 100 ns are as represented in FIGS. 9(A) to (D).

It was found in the Experiment 1 that the operating property was improved in the case where Zr was used as the carrier ion, as compared with the case where Cu was the carrier ion. However, even when, apart from that, Ta, Cr, Ti, and W are used, the operating property having the superior retaining property after the high speed operation can be obtained as in Zr by including Al in the ion source layer 3. Although the cause thereof is not necessarily certain, it can be considered that this is because the conductive path in the metal state formed in the writing operation is stable in the solid electrolyte of chalcogenide such as Te when Zr, Ta, Cr, Ti or the like is used as the carrier ion, as compared with the case in which only Cu is used. Therefore, it can be readily analogized that, other than Zr, Ta, Cr and Ti tested in the Experiments 1 and 2, a similar effect can be expected as long as the conductive path in the metal state is stable in the chalcogenide electrolyte. Specifically, it is possible to obtain the high speed operability and the retaining property of data thereof in a case where one of the transition metal elements of groups 4A, 5A, and 6A on the periodic table (Ti, Zr, Hf, V, Nb, Ta, Cr, Mo, W) is used as the carrier ion.

Figure 9:
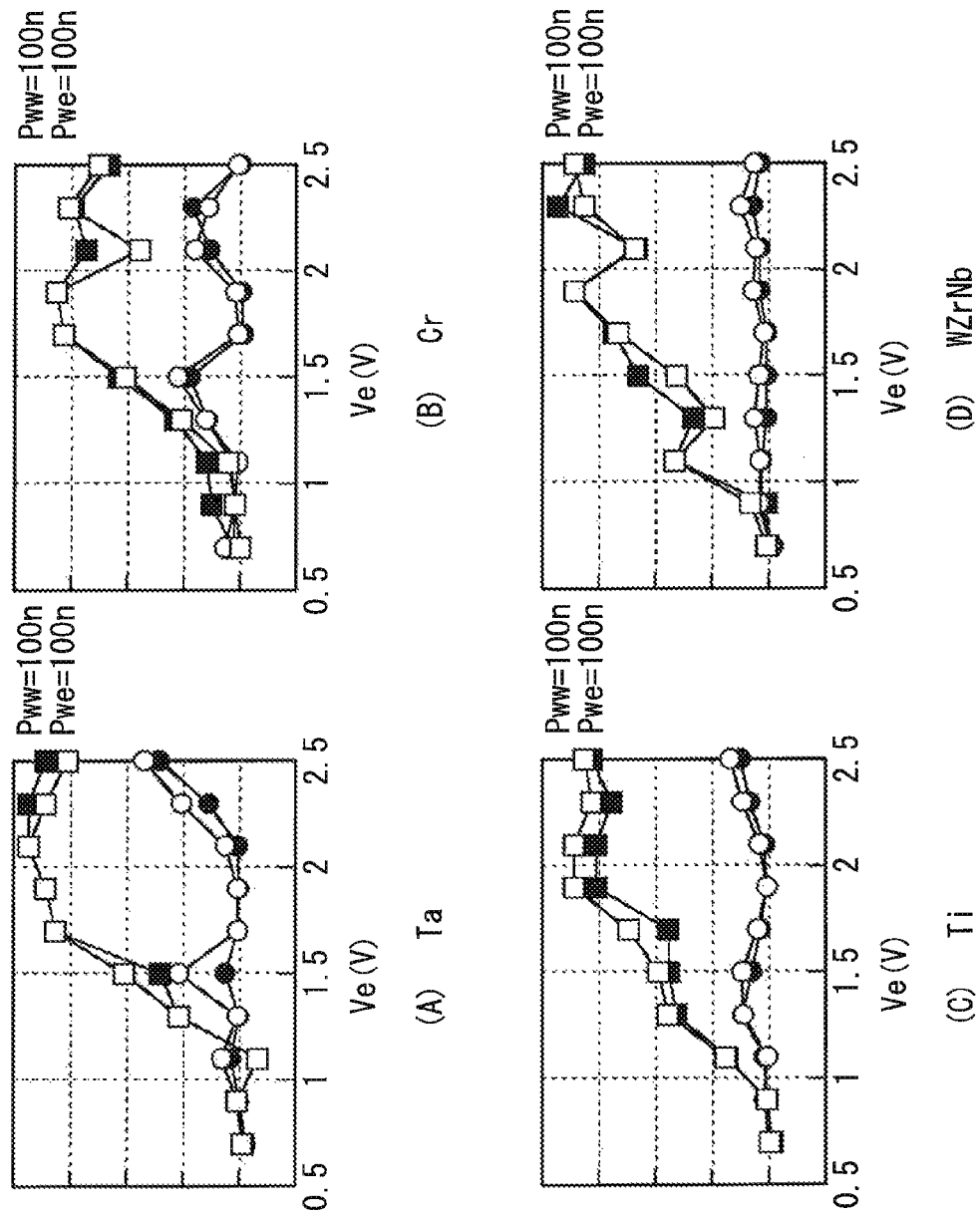
FIG. 9 Diagrams representing repetitive retaining properties in Examples 2 to 5.

In addition, it can be seen from FIG. 9(D) (Example 5) that the high speed operability and the data retaining property can also be obtained in a case where a mixture of the transition metal elements W—Zr—Nb is used as the carrier ion. Therefore, it can be readily analogized that two or more transition metal elements described above may be included, or that a similar operating property can be obtained even when other element is included as long as those elements are mainly used.

<Experiment 3>

Figure 10:
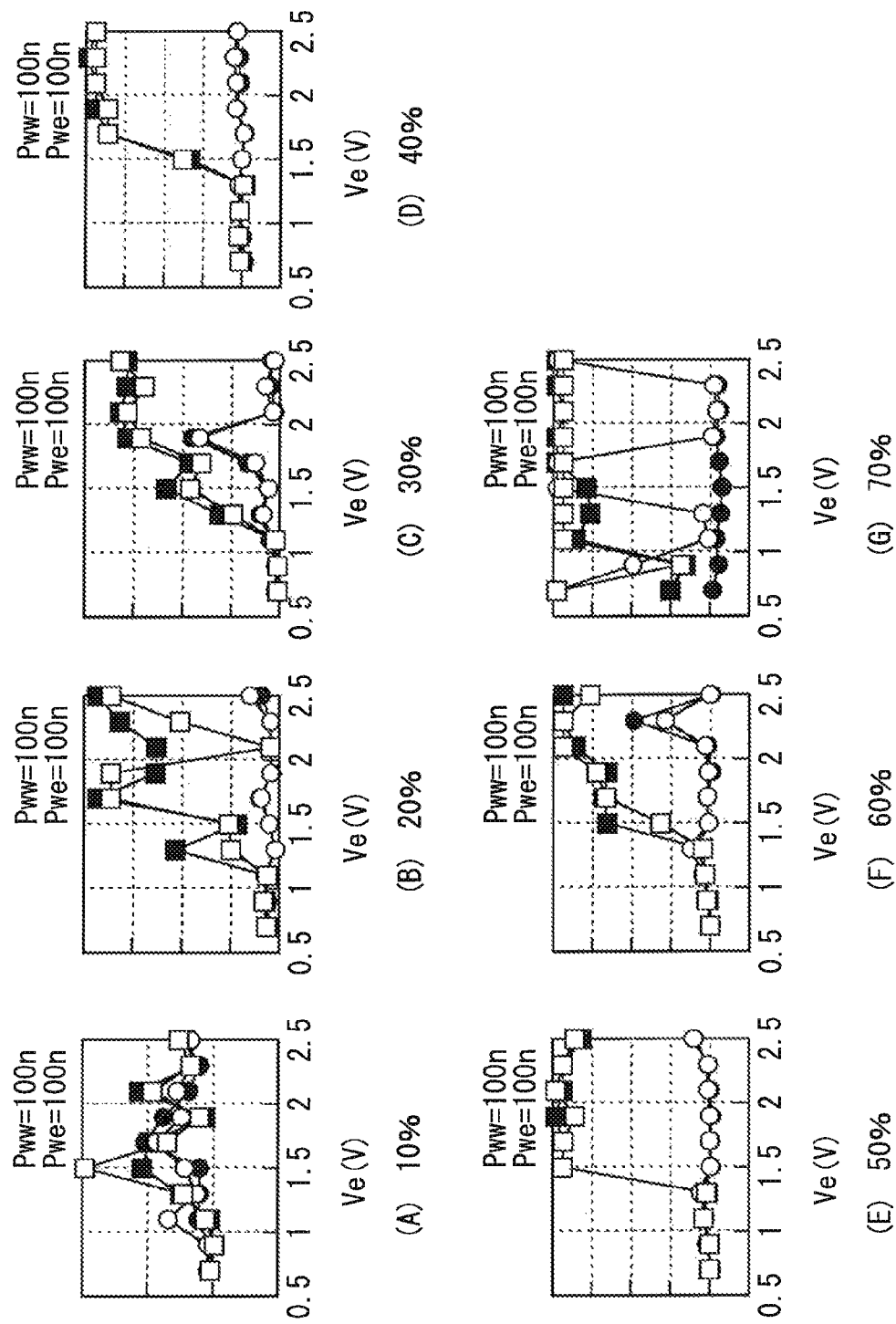
FIG. 10 Diagrams representing repetitive retaining properties in Comparative Example 3, in Examples 6 to 9 and in Comparative Example 4.

An additive amount of Al suitable for the present invention was studied by having a constant equivalent ratio between Zr and Te of 1 and varying the composition ratios of Al from 10, 20, 40, 50, and 60 to 70% (atomic %) (Examples 6 to 9, Comparative Examples 3 and 4). Results of the repetitive retaining test of a case where the pulse width was 100 ns in a similar manner as in the Examples 1 and 2 are as represented in FIG. 10.

There can be seen a tendency that a clear difference appears in the low-resistance state and the high-resistance state and the retaining property also improves at the same time as the amount of Al is increased. In a case where the amount of Al is too small, the favorable high-resistance layer such as the oxide film is not formed in the erasing operation and thus the high-resistance value which is sufficiently high by the erasure does not appear, since an effect of the Al-addition becomes little. However, although the writing and the erasing are possible, the retaining property deteriorates and the retaining property in the writing deteriorates in particular, in a case where the Al amount is increased to 70 atomic % by composition ratio. It is presumed that this is also because Al is presumably added too much and thus the high-resistance layer such as the oxide film is too likely to be generated. Therefore, the additive amount of Al by which the favorable properties are obtained is, preferably, between 20% and 60% both inclusive.

<Experiment 4>

A case in which both of Zr and Cu were used as the carrier ion in the ion source layer 3 was studied in accordance with the Examples 10 to 15. In the Examples 10 to 15, the ratio between Zr and Cu:Zr/(Cu+Zr) was varied at 1, 0.69, 0.5, 0.32, 0.15, and 0. Results of the repetitive retaining test of a case where the pulse width was 100 ns in a similar manner as in the Examples 1 to 3 are as represented in FIGS. 11(A) to (F).

Figure 11:
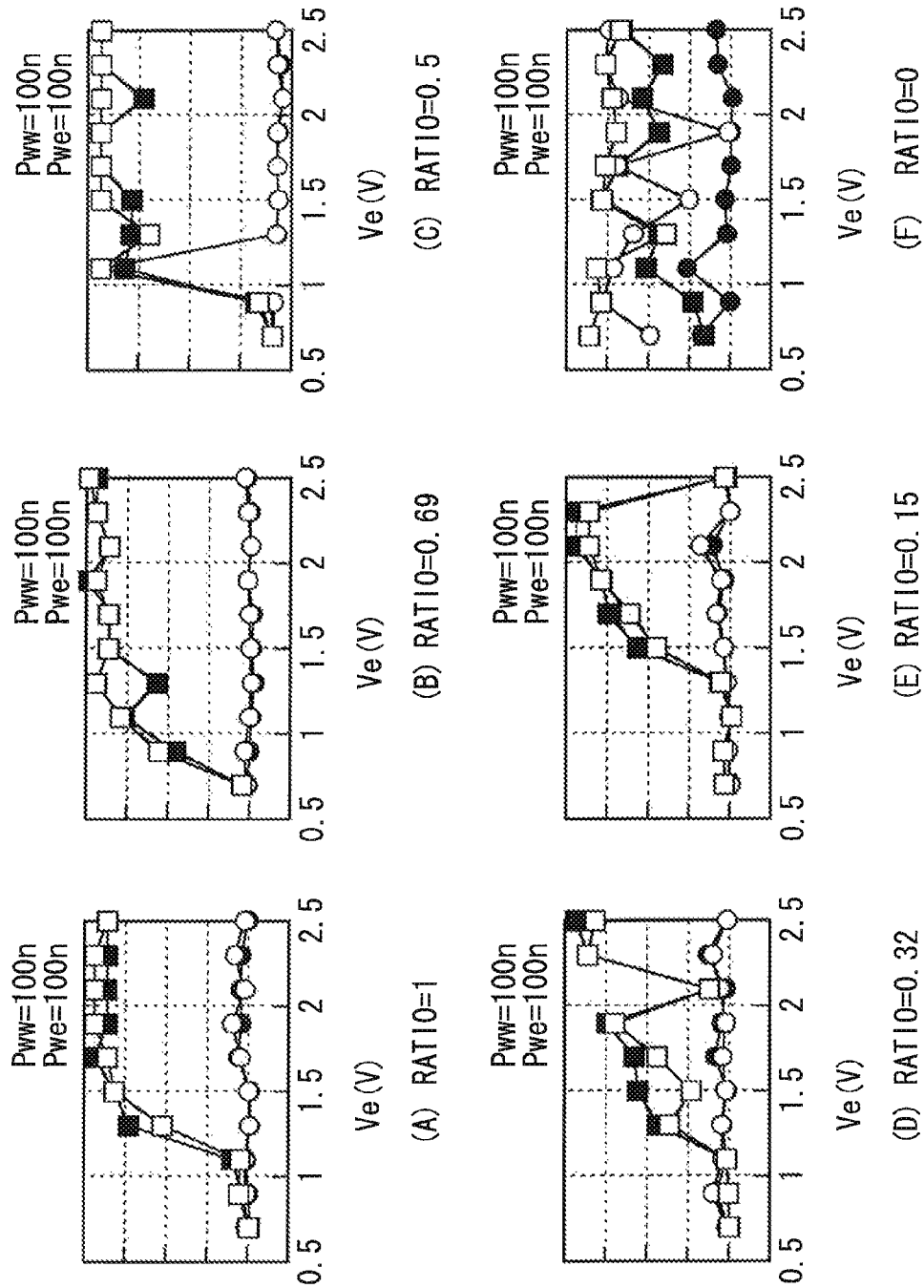
FIG. 11 Diagrams representing repetitive retaining properties in Examples 10 to 15.

It can be seen from the results of FIG. 11 that a similar operating property is exhibited even when a certain amount of Zr carrier ion is replaced by Cu. However, the retaining property on the erasure side starts to deteriorate when the ratio of Zr/(Cu+Zr) becomes less than 0.1 as represented in the figure. Therefore, it is preferable that a value of Zr/(Cu+Zr) be larger than 0.15. This applies similarly to the case where the transition metal element other than Zr (Ti, Hf, V, Nb, Ta, Cr, Mo, W) or the like is used as the carrier ion. Also, it can be readily analogized that a similar result can be obtained also in the case where Ag, Ni, Zn or the like, other than Cu, is added to the transition metal elements described above.

<Experiment 5>

Figure 12:
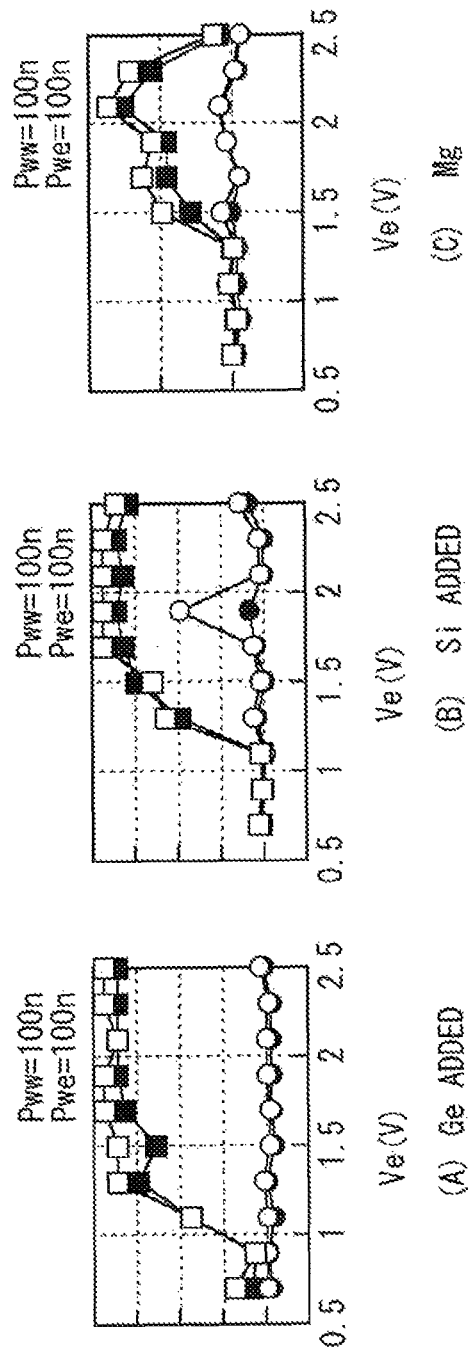
FIG. 12 Diagrams representing repetitive retaining properties in Examples 16 to 18.

Effects of cases in which Ge and Si are added to Al, as the element which forms the oxide in the erasure, were studied in accordance with the Examples 16 and 17, respectively. Also, a similar study was conducted for the Example 18 in which Mg was used instead of Al. Results of the repetitive retaining test of a case where the pulse width was 100 ns in a similar manner as in the Experiments 1 to 4 are as represented in FIGS. 12(A) to (C).

Both of the cases in which Ge is added and Si is added (Examples 16 and 17) exhibit favorable writing property, reflecting that Zr are used for the carrier ion. In other words, it is possible to add Ge or Si in addition to Al. Also, in the case of Mg, a part of Al may be replaced thereby to add it thereto, although it is also possible to replace the total amount of Al therewith as in the Example 18.

<Experiment 6>

Figure 13:
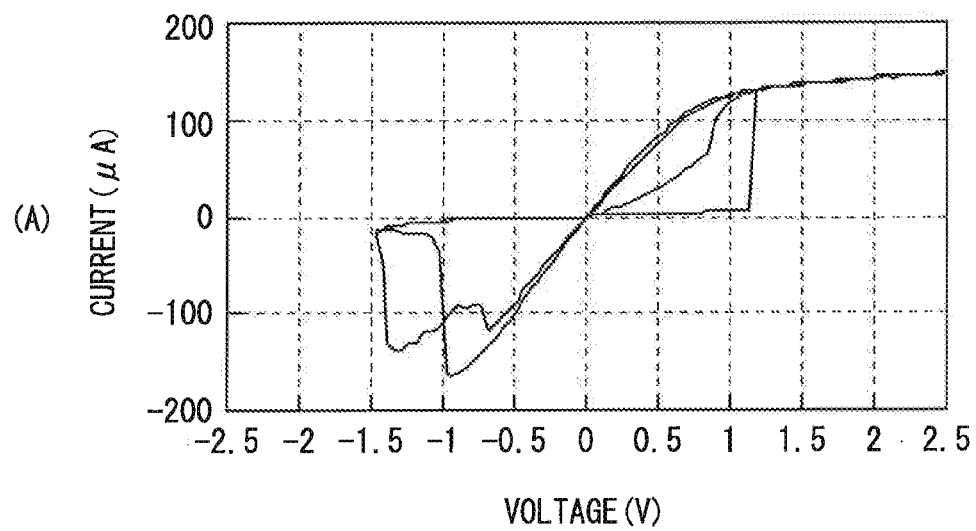
FIG. 13 Diagrams representing results of characteristic evaluation of a DC loop of Example 19.
Figure 13:
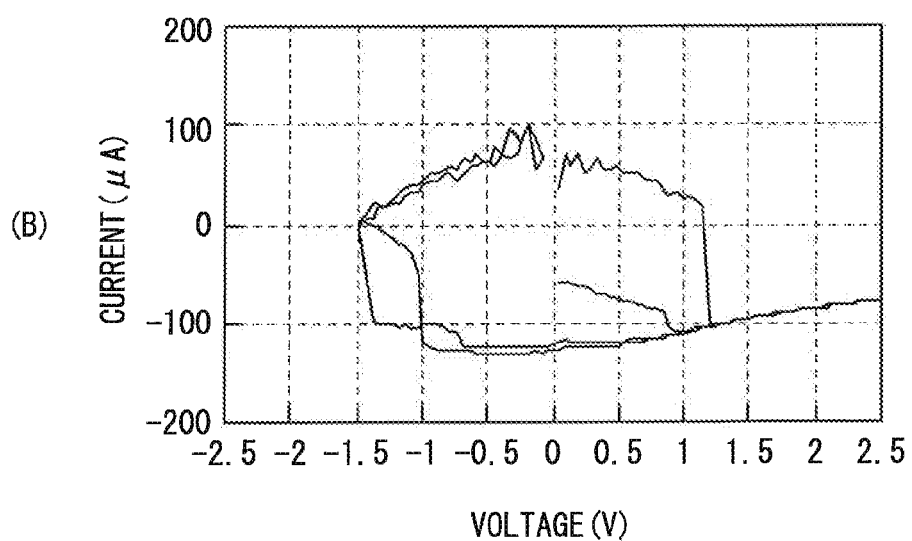
Figure 14:
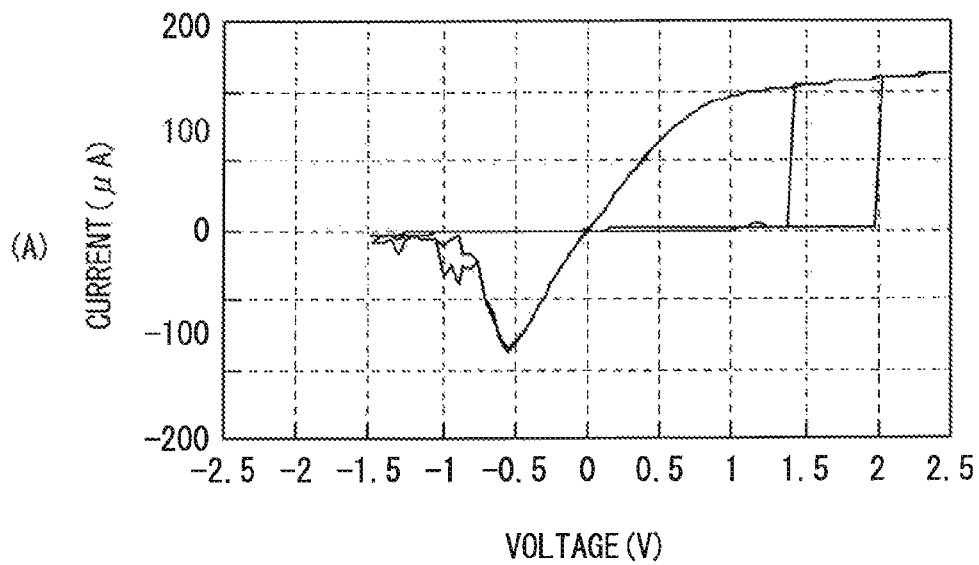
FIG. 14 Diagrams representing results of characteristic evaluation of a DC loop of the Example 1.
Figure 14:
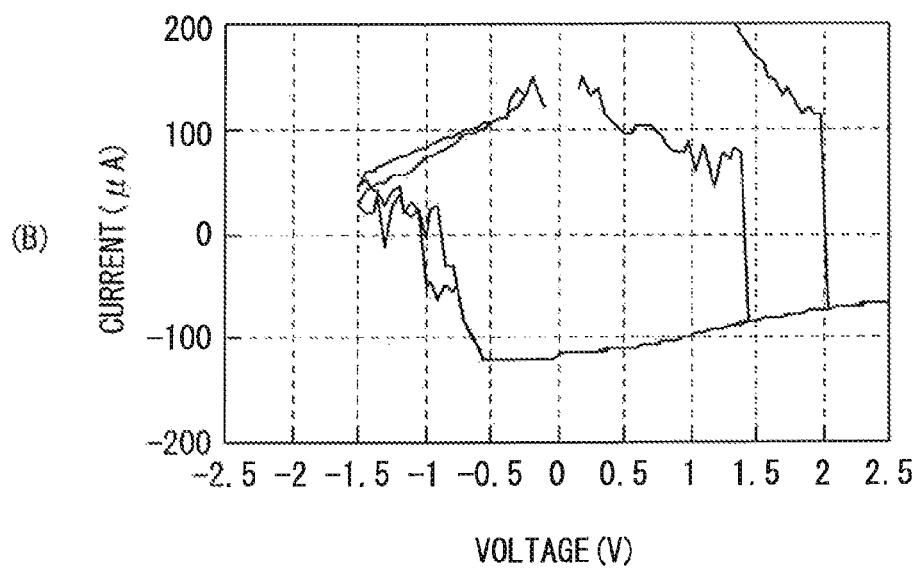

An experiment was conducted to confirm whether or not the memory cell 10 utilizing the ion source layer 3 operates without the high-resistance layer 2 for the writing. Results of a characteristic evaluation of a DC loop of the Example 19 having no high-resistance layer 2 are as represented in FIGS. 13(A) and (B). Meanwhile, results of the Example 1 having the high-resistance layer 2 are also represented in FIGS. 14(A) and (B).

As a result of FIGS. 13(A) and (B), it was found that in the case of the element having no high-resistance layer 2, although the initial resistance was low, it changed to the low-resistance by a positive applied voltage to the element and changed to the high-resistance by a negative applied voltage when a size of the element was sufficiently small, and that the memory operation was possible even when there was no high-resistance layer.

Although the present invention has been described in the foregoing by giving the embodiment and the Examples, the present invention is not limited to the above embodiment and the Examples, and various modifications are possible.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention claimed is:

1. A memory element comprising:
   a memory layer including an ion source layer between a first electrode and a second electrode, and configured to store information by a change in an electrical characteristic of the memory layer,
   wherein the ion source layer contains aluminum, together with an ion conductive material and a metal element to be ionized, and
   wherein the ion source layer includes at least one of transition metal elements including titanium, zirconium, hafnium, vanadium, niobium, tantalum, chromium, molybdenum, and tungsten as the metal element,
   wherein a content of aluminum included in the ion source layer is between 20 atomic % and 60 atomic % both inclusive.

2. The memory element according to claim 1, wherein the ion source layer includes at least one of germanium, magnesium, and silicon.

3. The memory element according to claim 1, wherein the metal element is at least one of zirconium, titanium and chromium.

4. The memory element according to claim 1, wherein the ion source layer includes copper as the metal element.

5. The memory element according to claim 4, wherein a ratio between the transition metal element and Cu in the ion source layer:

(a composition ratio of the transition metal element in atomic %)/{(a composition ratio of copper in atomic %)+(the composition ratio of the transition metal element in atomic %)} is larger than 0.15.

6. The memory element according to claim 1, wherein the ion conductive material of the memory layer is at least one of sulfur, selenium, and tellurium.

7. The memory element according to claim 1, wherein the memory layer has a high-resistance layer, which is higher in a resistance value than the ion source layer, between the ion source layer and the first electrode.

8. A memory element comprising:
a memory layer including an ion source layer between a first electrode and a second electrode, and configured to store information by a change in an electrical characteristic of the memory layer,
wherein the ion source layer contains at least one of aluminum and magnesium, together with an ion conductive material and a metal element to be ionized, and
wherein the ion source layer includes at least one of transition metal elements including titanium, zirconium, hafnium, vanadium, niobium, tantalum, chromium, molybdenum, and tungsten as the metal element,
wherein a content of aluminum included in the ion source layer is between 20 atomic % and 60 atomic % both inclusive.

9. A memory device comprising:
a plurality of memory elements, each memory element having a memory layer including an ion source layer between a first electrode and a second electrode and configured to store information by a change in an electrical characteristic of the memory layer, and pulse applying means for applying a pulse of a voltage or a current to the plurality of memory elements selectively,
wherein the ion source layer contains aluminum, together with an ion conductive material and a metal element to be ionized, and
wherein the ion source layer includes at least one of transition metal elements, including titanium, zirconium, hafnium, vanadium, niobium, tantalum, chromium, molybdenum, and tungsten as the metal element,
wherein a content of aluminum included in the ion source layer is between 20 atomic % and 60 atomic % both inclusive.

10. The memory device according to claim 9, wherein the ion source layer includes at least one of germanium, magnesium, and silicon.

11. The memory device according to claim 9, wherein the metal element is at least one of zirconium, titanium and chromium.

12. The memory device according to claim 9, wherein the ion source layer includes copper as the metal element.

13. The memory device according to claim 12, wherein a ratio between the transition metal element and copper in the ion source layer:

(a composition ratio of the transition metal element in atomic %)/{(a composition ratio of copper in atomic %)+(the composition ratio of the transition metal element in atomic %)} is larger than 0.15.

14. The memory device according to claim 9, wherein the ion conductive material of the memory layer is at least one of sulfur, selenium, and tellurium.

15. The memory device according to claim 9, wherein the memory layer has a high-resistance layer, which is higher in a resistance value than the ion source layer, between the ion source layer and the first electrode.

16. The memory device according to claim 9, wherein each of the memory elements stores the binary or more multi-value information.

17. The memory device according to claim 9, wherein at least a part of at least one of the layers structuring the memory element is a common layer with corresponding layers in the adjacent plurality of memory elements.

18. The memory device according to claim 17, wherein the layers which are common in the plurality of memory elements are a high-resistance layer, the ion source layer, and the upper electrode, and the lower electrode is formed individually for each of the elements.

19. A memory element comprising:
a memory layer including an ion source layer between a first electrode and a second electrode, and configured to store information by a change in an electrical characteristic of the memory layer, wherein
the ion source layer contains aluminum, together with an ion conductive material and a metal element to be ionized,
wherein a content of aluminum included in the ion source layer is between 20 atomic % and 60 atomic % both inclusive.

20. A memory device comprising:
a plurality of memory elements, each memory element having a memory layer including an ion source layer between a first electrode and a second electrode and configured to store information by a change in an electrical characteristic of the memory layer, and pulse applying means for applying a pulse of a voltage or a current to the plurality of memory elements selectively,
wherein the ion source layer contains aluminum, together with an ion conductive material and a metal element to be ionized, and
wherein a content of aluminum included in the ion source layer is between 20 atomic % and 60 atomic % both inclusive.

21. The memory element according to claim 19, wherein the ion source layer includes at least one of germanium, magnesium, and silicon.

22. The memory element according to claim 19, wherein the metal element is at least one of zirconium, titanium and chromium.

23. The memory element according to claim 19, wherein the ion source layer includes copper as the metal element.

24. The memory element according to claim 23, wherein a ratio between the transition metal element and Cu in the ion source layer:

(a composition ratio of the transition metal element in atomic %)/{(a composition ratio of copper in atomic %)+(the composition ratio of the transition metal element in atomic %)} is larger than 0.15.

25. The memory element according to claim 19, wherein the ion conductive material of the memory layer is at least one of sulfur, selenium, and tellurium.

26. The memory element according to claim 19, wherein the memory layer has a high-resistance layer, which is higher in a resistance value than the ion source layer, between the ion source layer and the first electrode.

27. The memory device according to claim 20, wherein the ion source layer includes at least one of germanium, magnesium, and silicon.

28. The memory device according to claim 20, wherein the metal element is at least one of zirconium, titanium and chromium.

29. The memory device according to claim 20, wherein the ion source layer includes copper as the metal element.

30. The memory device according to claim 29, wherein a ratio between the transition metal element and copper in the ion source layer:

(a composition ratio of the transition metal element in atomic %)/{(a composition ratio of copper in atomic %)+(the composition ratio of the transition metal element in atomic %)} is larger than 0.15.

31. The memory device according to claim 20, wherein the ion conductive material of the memory layer is at least one of sulfur, selenium, and tellurium.

32. The memory device according to claim 20, wherein the memory layer has a high-resistance layer, which is higher in a resistance value than the ion source layer, between the ion source layer and the first electrode.

33. The memory device according to claim 20, wherein each of the memory elements stores the binary or more multi-value information.

34. The memory device according to claim 20, wherein at least a part of at least one of the layers structuring the memory element is a common layer with corresponding layers in the adjacent plurality of memory elements.

35. The memory device according to claim 34, wherein the layers which are common in the plurality of memory elements are a high-resistance layer, the ion source layer, and the upper electrode, and the lower electrode is formed individually for each of the elements.

* * * * *